United States Patent [19]

Pham et al.

[11] Patent Number: 4,752,743
[45] Date of Patent: Jun. 21, 1988

[54] LINEARIZER FOR TWT AMPLIFIERS

[75] Inventors: David Pham, Milpitas; Allan Podell, Palo Alto; John A. Steck, Cupertino, all of Calif.

[73] Assignee: Varian Associates, Inc., Palo Alto, Calif.

[21] Appl. No.: 912,448

[22] Filed: Sep. 26, 1986

[51] Int. Cl.[4] .............................................. H03F 1/33
[52] U.S. Cl. ...................................... 330/149; 330/43
[58] Field of Search .......................... 330/43, 45, 149; 328/162; 332/18, 37 R; 375/60; 455/50, 63

[56] References Cited

U.S. PATENT DOCUMENTS 3,849,676 11/1974 Bareyt ................................ 330/43 X Primary Examiner—James B. Mullins
Attorney, Agent, or Firm—Stanley Z. Cole; Gerald M. Fisher; Peter J. Sgarbossa

[57] ABSTRACT

The input signal to a TWT amplifier is predistorted in amplitude and phase to the inverse of the amplifier transfer characteristic by an adjustable circuit including a phase linearizing section and an amplitude linearizing section, both in series with the input signal and amplifier. Each section includes two pairs of back-to-front Schottky diodes. Preferably an additional diode is in series with one pair for the amplitude section. The diodes of each pair are of like polarity and opposite to the diodes of the other pair of the section. Additional diodes are connected between the pair junctions and ground, and adjustable D.C. bias fed into these junctions. Additional resistors and capacitors bridge the pairs, and are arranged into a phase delay network in one of the sections.

4 Claims, 5 Drawing Sheets

[4,752,743]

LINEARIZER FOR TWT AMPLIFIERS

FIELD OF THE INVENTION

The invention pertains to microwave amplifiers using linear-beam electron tubes such as traveling-wave tubes or klystrons as the power output generators. These tubes have transfer characteristics which saturate with increasing rf drive levels. When amplifying amplitude-modulated signals such as television the modulation level must be limited to the linear part of the charactistic to preserve amplitude linearity and low harmonic and intermodulation distortion. (In satellite transmission systems several channels are often transmitted by the same tube. Thus the high efficiencies obtained by driving near saturation are not obtainable.)

PRIOR ART

It is known that the distortions incurred in driving the output tube near saturation can be lessened by predistorting their input signals in amplitude and phase response to the inverse of the tube's transfer characteristic, so the overall response approaches linearity.

FIG. 1 illustrates the typical case. The amplitude transfer characteristic of a typical velocity-modulated amplifier consists of a linear portion 10 followed at high drive levels by a smoothly saturating portion 12, reaching a peak output at the "saturation" point 14 when the drive is the "saturation drive" 13. In FIG. 2 this is plotted as a gain curve to illustrate compensation. Curve 12' is the tube's gain in dB vs. drive amplitude. If the tube were preceded by a circuit with gain response as shown by curve 16, an amplitude expansion with increasing signal, the resulting over-all response would be greatly linearized, approaching the straight line 18.

An early scheme for doing this is shown in FIG. 3. In series with the input signal line are inserted a back-to-back pair of diodes, such as semiconductor Schottky diodes 22, 24 which have a conductance increasing with signal amplitude. Thus the transmission from input to output rises with signal level, making a first step toward linearizing the total amplifier response.

This scheme has many weaknesses. The characteristics of the diodes do not match the TWT's very well. Also, different TWT's have different saturation characteristics, and it is not feasible to find diodes with all the desired characteristics.

SUMMARY OF THE INVENTION

An object of the invention is to provide a traveling-wave-tube power amplifier having linear amplitude response up to a drive level approaching saturation.

A futher object is to provide an amplifier with constant phase response.

A further object is to provide an amplifier with reduced harmonic and intermodulation distortion.

A still further object is to provide an amplifier of increased efficiency and power.

These objects are realized by a circuit for predistortion to cancel the distortion produced in the velocity-modulated output tube. The linearizer circuit is adjustable to fit a wide variety of amplifier tubes.

DESCRIPTION OF THE PREFERRED EMBODIMENT

The invention can best be understood by dividing it into two sections, although the performance in combination is the important result.

Figure 4:
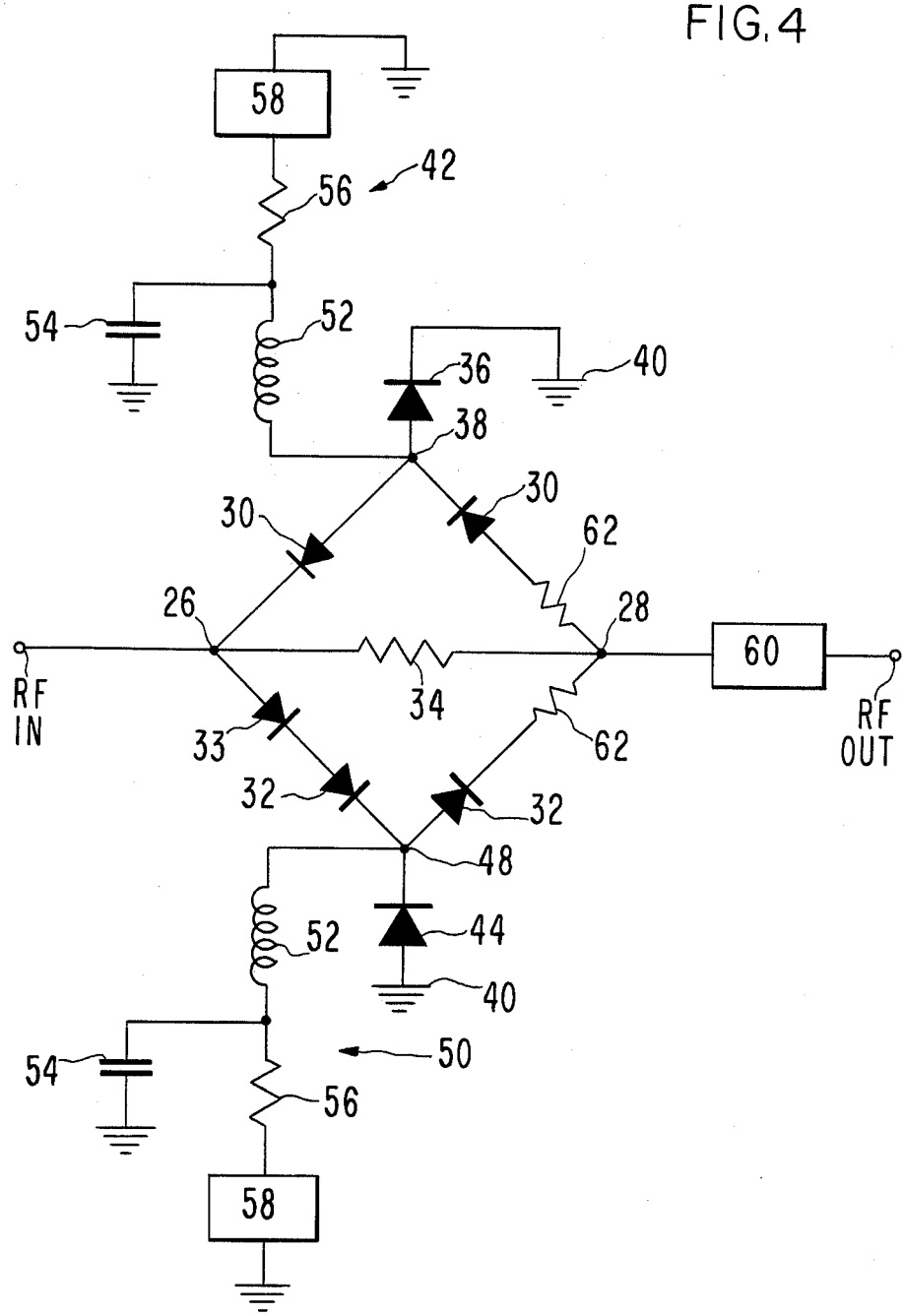
FIG. 4 is a schematic diagram of a circuit embodying the amplitude section of the invention.

In FIG. 4 we see a simplified schematic circuit of the basically amplitude-linearizing section. In operation this section is in series with the phase linearizer, to be described below, which latter also corrects a small phase distortion introduced by the amplitude section. Both sections are in series with the input signal to the amplifier.

Figure 1:
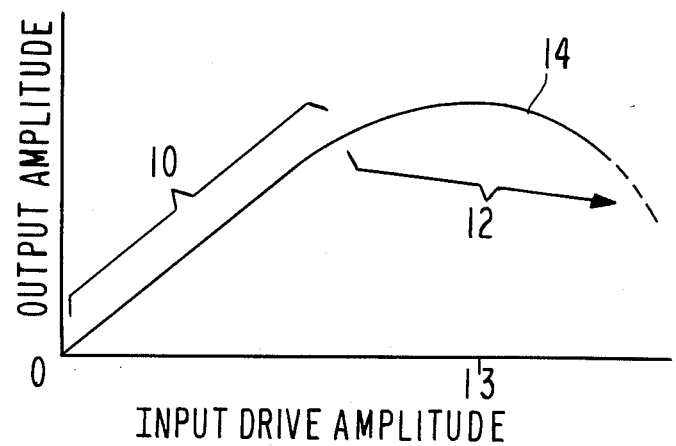
FIG. 1 is a sketch of the amplitude transfer characteristic of a typical traveling-wave tube.
Figure 2:
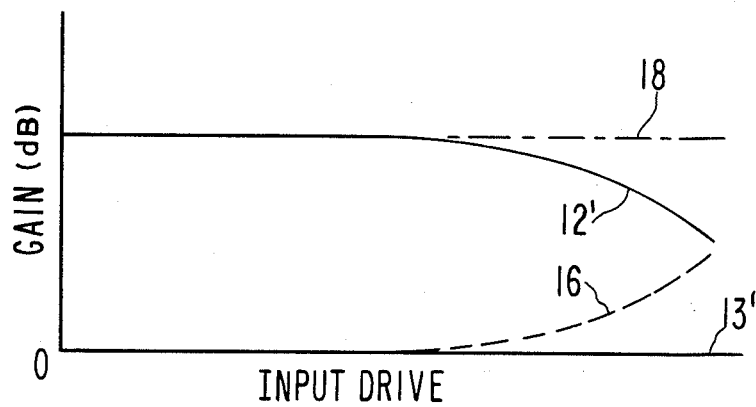
FIG. 2 is a sketch of the transfer characteristic of FIG. 1 plotted on a scale of decibel gains.
Figure 3:
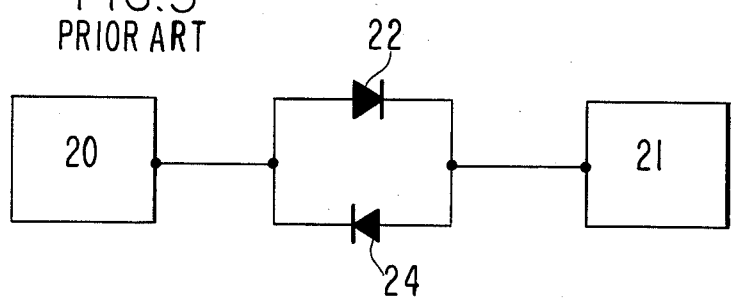
FIG. 3 is a schematic diagram of a prior-art compensating circuit.

The amplitude predistorter or corrector section has an input terminal 26 and output terminal 28. Between them are connected two pairs of semiconductor diodes such as Schottky diodes 30 and 32, the diodes of each pair being of like polarity and opposite to the diodes of the other pair. Thus the D.C. rectified current merely circulates and the overall impedance is non-directional. This much of the circuit resembles the prior-art circuit of FIG. 3. Additional components make the circuit adjustable to provide the desired characteristics to match particular amplifier tubes. A resistor 34 is connected in parallel with the diode pairs to provide an unvarying component of conduction. Individual adjustment is provided by connecting an additional diode 36 and 44 between the junction 38, 48 of the diodes of each pair and rf ground 40. D.C. bias currents are fed into the junctions 38, 48. They control the rf levels at which the various diodes become lower impedances and hence expand the transfer characteristic as desired. Each D.C. bias is fed through a series inductor 52 bypassed to ground by a capacitor 54, and fed through a resistor 56 connected to an adjustable bias voltage source 58.

For certain distortion characteristics an additional diode 33 may be added in series with one pair 32. The diodes preferably comprise a combination of low, medium and high-barrier Schottky diodes in order to better approximate certain distortion characteristics. Also resistors 62 may be placed in series with one or both pairs. A buffer amplifier 60 may be used to isolate the circuit section.

The performance of the amplitude predistorting section, in combination with any amplitude effects introduced by the phase section and the inherent distortion of the TWT is discussed below. Of course the amplitude section also introduces non-linear phase distortion, due to diode capacitance and lead inductance, which combines with the other non-linear phase characteristics.

Figure 5:
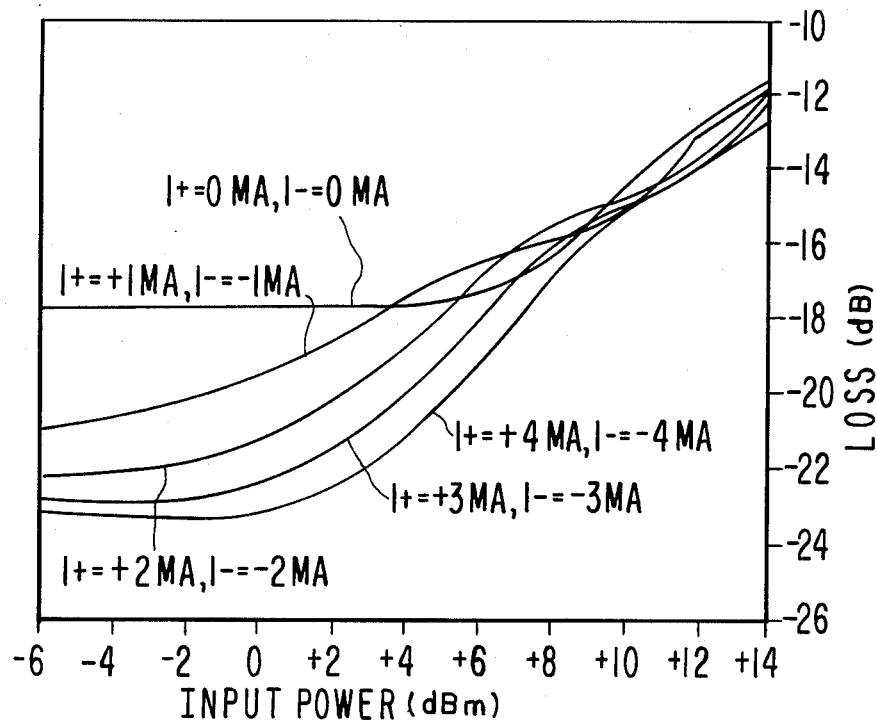
FIG. 5 is a set of typical amplitude-expansion characteristics.

In FIG. 5 is shown a set of amplitude-expansion characteristics obtained with the circuit of FIG. 4 with various settings of bias currents $I_+$ and $I_-$, illustrating the range of control available with just two external D.C. controls.

Figure 6:
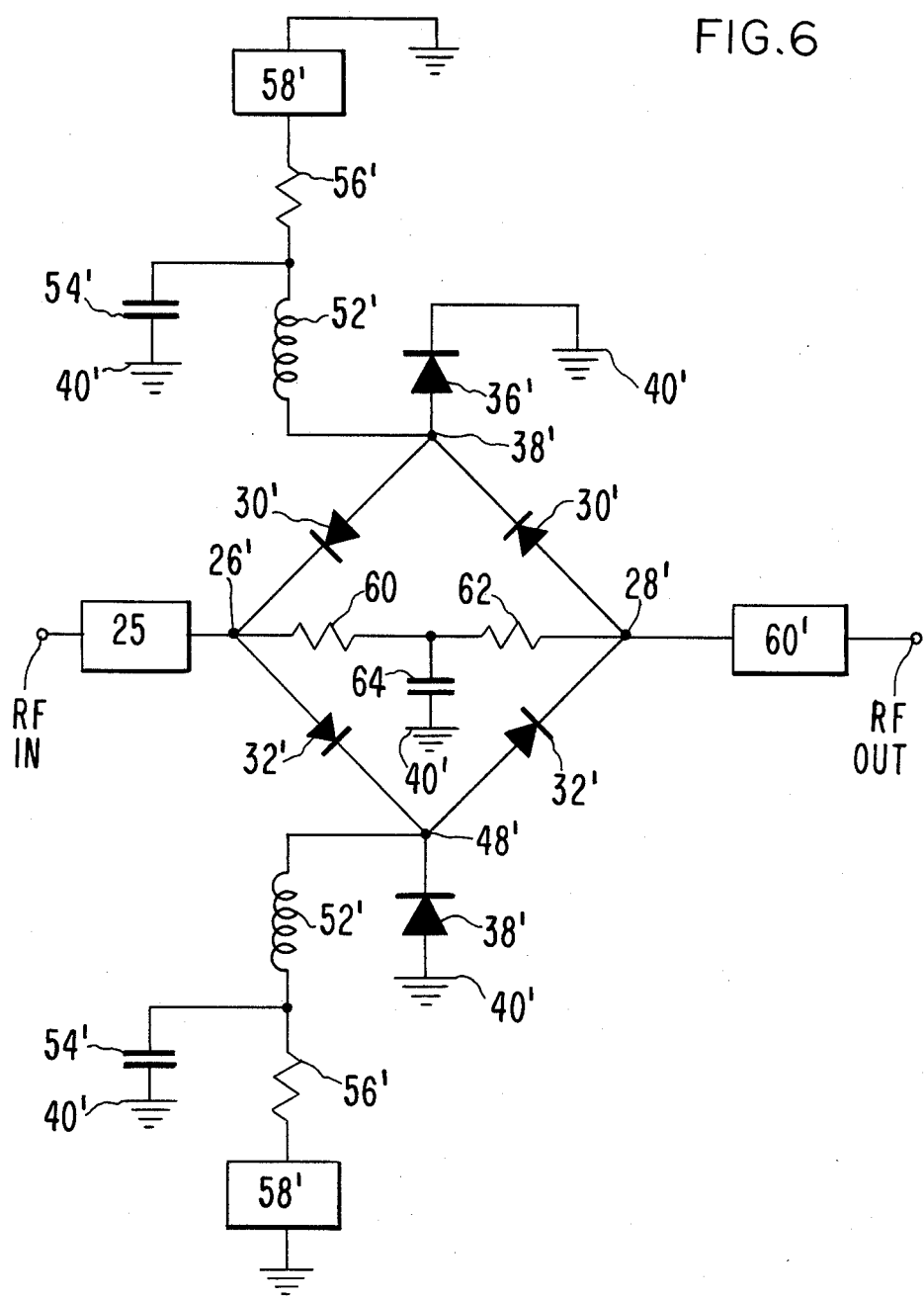
FIG. 6 is a schematic diagram of a circuit embodying the phase section of the invention.

FIG. 6 is a schematic diagram of the phase predistortion section of the linearizer. In the TWT amplifier tube, there is a phase lag that sets in at drive levels approaching saturation and increases with increasing drive. This is due to the inherent non-linearity of the velocity modulation process for large signals and the slowing down of the electrons as energy is extracted from them into the interaction circuit. The purpose of the phase corrector section is thus to introduce a phase advance with increasing drive power.

The circuit to do this, FIG. 6, includes pairs of back-to-front diodes similar to the amplitude expander circuit of FIG. 4. Similar components in FIG. 6 are numbered like the corresponding ones in FIG. 4 In addition there is a phase-delay network between input 26' and output 28' consisting of replacing resistor 34 with a pair of series resistors 60, 62 shunted at their mid-connection to ground 40' by a capacitor 64. Also preferably added is a conventional matching transformer 25 between the incoming RF driver signal and circuit input 26'. If as is typical, the impedance bf the input signal source is the 50-ohm standard impedance of typical microwave networks, and the phase predistortion section would like to see a lower impedance, for example 25 ohms, then the matching transformer reduces the impedance accordingly; it can for example be a quarter wave matching transformer. It should also be noted that the matching transformer can help to alleviate source loading effects on the phase predistortion section. Because of this benefit, it will be preferable to utilize such a matching transformer also in the input of the amplitude predistortion section. In this way optimal performance is facilitated since source loading effects are minimized.

As the signal rises the diode pairs 30' and 32' become lower impedance, reducing the current through the R-C network 60, 62, 64 and thus reducing its inherent phase delay. Also, the series capacitances of diodes 30', 32' become more effective in providing phase-advanced current. As with the amplitude predistortion section of FIG. 4, the amount of predistortion is controlled by the bias currents fed into auxiliary diodes 36' and 38'. Also analogously with the amplitude predistortion section, the diodes of this section preferably comprise both low and medium barrier Schottky diodes, to better approximate desired distortion characteristics.

It will be recalled in the case of the amplitude predistortion section, that the curves illustrated in FIG. 5, plotting loss in dB with input power, showed some of the various amplitude expansion characteristics possible with various settings of D.C. bias. These curves are also generally illustrative of some of the phase expansion characteristics obtainabler from the phase predistortion section at various settings of D.C. bias. Utilizing the vertical left hand axis, it will be seen that these curves may also be considered plots of phase shift in degrees with input power. Just as in the case of the amplitude predistortion section, a good range of adjustability for various desired predistortion characteristics is therefore obtainable.

The positioning of matching transformer 25 ahead of the phase predistortion section of course assumes that the input signal is first to be directed through the phase predistortion section, rather than the amplitude predistortion section. This is in fact the preferred arrangement; however, an arrangement in which the amplitude predistortion section is positioned first may also be possible.

In both the amplitude and phase predistortion sections, it has been stated above that control of the predistortion is provided by the D.C. bias currents. However, the predistortion will in both cases depend also on the amplitude level of the input signal, due to the nature of these diode circuits. If the level of input drive into both sections is not above a certain range, they will not be operating within the appropriate transfer region which would provide a proper predistortion function. Also the optimal degree of predistortion may not be obtainable without controlling the gain level of the input signal. Accordingly, it is preferred to insert a conventional linear gain control circuit (not shown) in series with and ahead of each section. The capability to adjust the input signal drive level thereby provided will make possible optimal adjustability of the predistortion and these provide optimal compatability betwen the successive stages.

Other components which may preferably be utilized in series between the output of the linearizer and the TWT amplifier sought to be driven are a further conventional linear gain control circuit, and a conventional amplitude equalizer. The utility for this linear gain control occurs when the output of the linearizer is within a range which is either too high or too low for a particular TWT. As is well-known, the range of the drive signal must not be so great as to drive the TWT into saturation, nor so low that only a fraction of the expected power output is produced. Thus a final linear gain control may be useful where it is necessary to match the dynamic range of the linearizer output to the input requirements of a TWT which may demand a somewhat different range.

The signal from the linearizer, adjusted as above, may also not have the degree of flatness of response over a desired frequency range for a given communications application. In particular, the network may not have the same response to a given signal level at one frequency as compared to another frequency in the desired range. Thus depending on the application, it can be desirable to add a conventional amplitude equalizer to compensate this response between the linearizer output and the TWT input to achieve a desired reasonable degree of flatness of frequency response.

Figure 7:
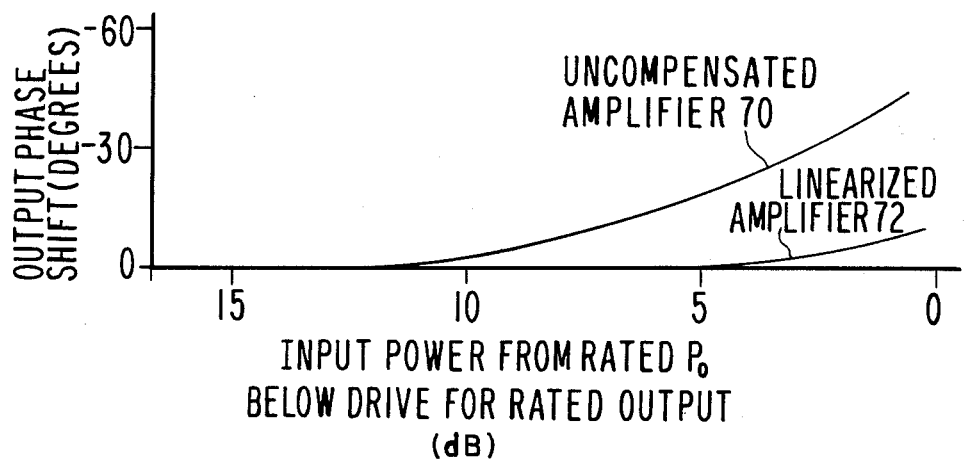
FIG. 7 is a graph of the uncorrected and corrected phase response of a typical amplifier.

FIG. 7 is a graph of relative phase delay of the uncompensated TWT amplifier 70 and the integrated amplifier 72 as linearized with the inventive circuit.

Figure 8:
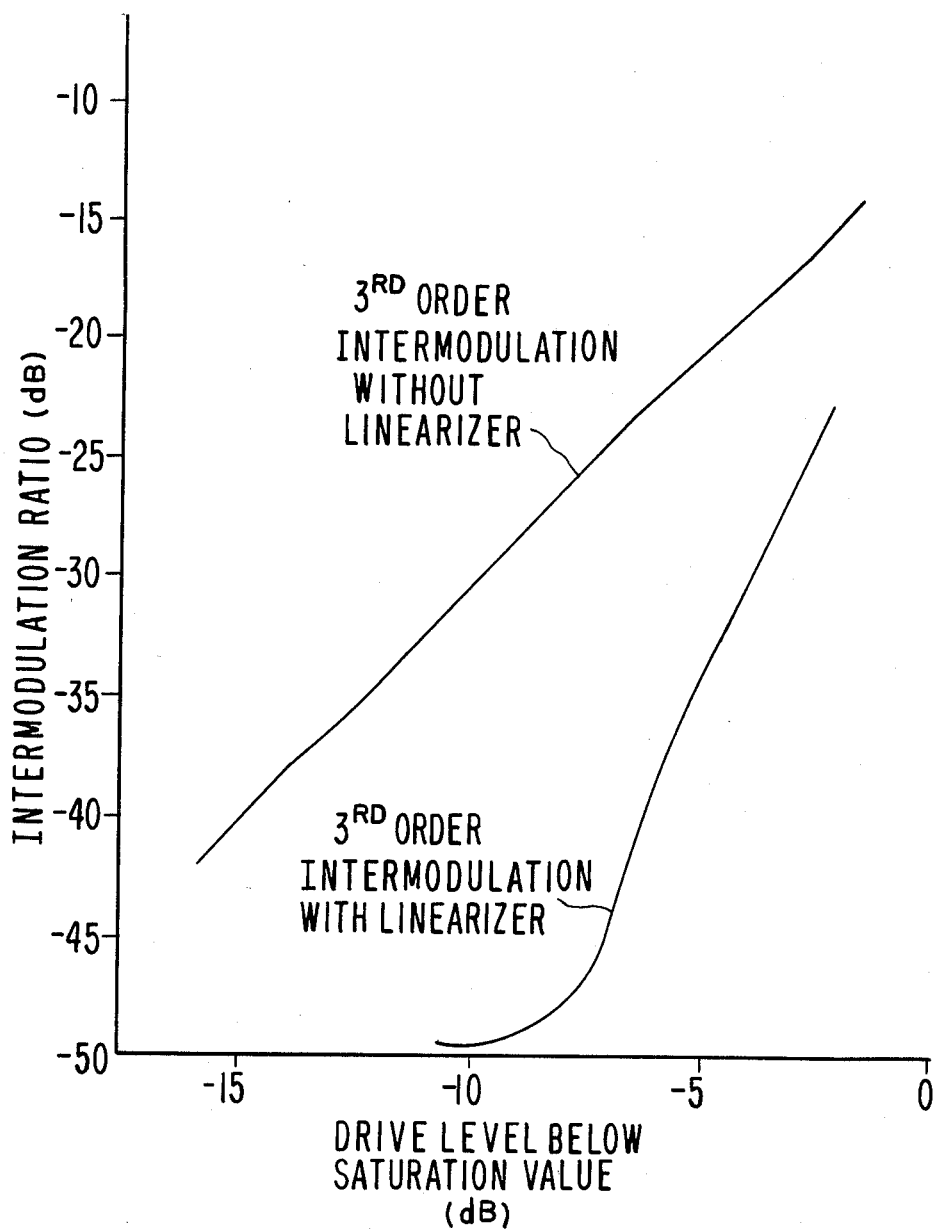
FIG. 8 is a graph of the intermodulation distortion of a typical amplifier.

An important net effect on the performance degradation from the combined amplitude and phase non-linearity of the TWT is the resultant intermodulation distortion. This is most important during simultaneous transmission of several signal channels as is usual with satellite communication networks. FIG. 8 is a graph of the intermodulation ratio of the dominant third order intermodulation product of an uncompensated TWT amplifier 74 and the linearized integrated amplifier 76. Higher order odd intermodulation ratios are well below the third order.

The above particular embodiments are examplary. It will be obvious to those skilled in the art that many variations may be substituted within the scope of the invention, as different types of diodes such as PIN diodes, etc. Many kinds of circuit wiring may be used, with discrete at integrated circuits.

The scope of the invention is to be limited only by the following claims and their legal equivalents.

We claim:

1. A linearizer for pre-distorting the input signal of a traveling wave tube amplifier comprising:
    an amplitude compensating section and a phase compensating section, in series, each of said compensating sections comprising:
    an input terminal and an output terminal,
    a first pair of semiconductor diodes connected in series in the same, first direction of polarization between said input and output terminals,
    a second pair of semiconductor diodes connected in series in the same, second direction opposite to said first direction between said input and output terminals,
    a resistor connected between said input and output terminals,
    a fifth semiconductor diode connected from the first common connection between said first pair of diodes and a radio-frequency ground,
    means for supplying an adjustable forward bias current through said fifth diode,
    a sixth semiconductor diode connected in a polarity opposite to said fifth diode from a second common connection between said second pair of diodes and said radio-frequency ground,
    means for supplying an independently adjustable forward bias current through said sixth diode,
    said phase compensating section also comprising a capacitor connected between a midpoint of said resistor and said ground.

2. The linearizer of claim 1 wherein said means for supplying bias current comprises an isolating choke in series with a current supply.

3. The linearizer of claim 1 in which said amplitude compensating section further includes resistors in series with at least one of said pairs of diodes.

4. The linearizer of claim 1 further comprising a buffer amplifier between said amplitude compensating section and said phase compensating section.

* * * * *